US009181623B2

(12) United States Patent
Mevellec et al.

(10) Patent No.: US 9,181,623 B2
(45) Date of Patent: Nov. 10, 2015

(54) SOLUTION AND PROCESS FOR ACTIVATING THE SURFACE OF A SEMICONDUCTOR SUBSTRATE (75) Inventors: Vincent Mevellec, Boulogne Billancourt (FR); Dominique Suhr, Chatenay Malabry (FR)

(73) Assignee: ALCHIMER, Massy (FR)

( * ) Notice: Subject to any disclaimer, the term of this patent is extended or adjusted under 35 U.S.C. 154(b) by 812 days.

(21) Appl. No.: 13/390,208

(22) PCT Filed: Sep. 9, 2010

(86) PCT No.: PCT/EP2010/063210
§ 371 (c)(1),
(2), (4) Date: Mar. 8, 2012

(87) PCT Pub. No.: WO2011/029860
PCT Pub. Date: Mar. 17, 2011

(65) Prior Publication Data
US 2012/0156892 A1      Jun. 21, 2012

(30) Foreign Application Priority Data

Sep. 11, 2009  (FR) .................................... 09 56262
Dec. 30, 2009  (FR) .................................... 09 59676

(51) Int. Cl.
C23C 18/30        (2006.01)
C23C 18/32        (2006.01)
(Continued)

(52) U.S. Cl.
CPC ......... *C23C 18/1882* (2013.01); *C23C 18/1653* (2013.01); *C23C 18/1696* (2013.01);
(Continued)

(58) Field of Classification Search
CPC .... C23C 18/30; C23C 18/32; C23C 18/1653; C23C 18/1696; C23C 18/1879; C23C 18/1882; C23C 18/2066
USPC .......................................... 106/1.11; 427/123
See application file for complete search history.

(56) References Cited

U.S. PATENT DOCUMENTS 4,661,384 A * 4/1987 Sirinyan et al. ............... 106/1.11
5,264,288 A * 11/1993 Das et al. ....................... 428/434
7,632,343 B2 * 12/2009 Kojima et al. ............... 106/1.28
8,883,641 B2 * 11/2014 Mevellec et al. ............. 106/1.28

FOREIGN PATENT DOCUMENTS

EP          0 092 601        11/1983

OTHER PUBLICATIONS

McDonald et al."'Click' Immobilization of Organometallic Pincer Catalysts for C—C Coupling Reactions", Organometallics Aug. 24, 2009 American Chemical Society, vol. 28, No. 16, Aug. 24, 2009 (pp. 4689-4699), XP002578436.
(Continued)

*Primary Examiner* — Helene Klemanski
(74) *Attorney, Agent, or Firm* — Hamre, Schumann, Mueller & Larson, P.C.

(57)  ABSTRACT

A solution and a process are used for activating the surface of a substrate comprising at least one area formed from a polymer, for the purpose of subsequently covering it with a metallic layer deposited via an electroless process. The composition contains: A) an activator formed from one or more palladium complexes; B) a binder formed from one or more organic compounds chosen from compounds comprising at least two glycidyl functions and at least two isocyanate functions; and C) a solvent system formed from one or more solvents capable of dissolving said activator and said binder. The solution and process may be applied for the manufacture of electronic devices such as integrated circuits, especially in three dimensions.

21 Claims, 2 Drawing Sheets (51) Int. Cl.
    *C23C 18/18*     (2006.01)
    *C23C 18/16*     (2006.01)
    *C23C 18/20*     (2006.01)
    *H01L 21/768*    (2006.01)

(52) U.S. Cl.
    CPC ......... *C23C18/1879* (2013.01); *C23C 18/2066* (2013.01); *C23C 18/30* (2013.01); *C23C 18/32* (2013.01); *H01L 21/76898* (2013.01)

(56) References Cited

OTHER PUBLICATIONS

Vassylyev cl al., "Catalytic Properties of Several Supported Pd (II) Complexes for Suzuki Coupling Reactions." Tetrahedron Letters, Elsevier, Amsterdam, NL, vol. 46, No. 40, Oct. 3, 2005, (pp. 6865-6869), XP025385966.

* cited by examiner

SOLUTION AND PROCESS FOR ACTIVATING THE SURFACE OF A SEMICONDUCTOR SUBSTRATE

The present invention relates generally to the manufacture of electronic devices, in particular such as integrated circuits, especially in three dimensions, and a subject is in particular a solution and a process for activating the surface of a substrate comprising at least one area formed from a polymer, for the purpose of subsequently covering it with a metal layer deposited by an electroless route.

The invention finds its application essentially in the field of microelectronics for the metallization especially with copper of through vias (also known as "through silicon vias" or "through wafer vias" or "through wafer interconnects"), which are the cornerstone of integration of electronic chips (or "dies") in three dimensions (3D) or vertical integration. It also finds its application in other fields of electronics in which a substrate comprising through vias must be electrically insulated and covered with a layer of copper. Mention will be made in this context of the manufacture of interconnecting elements in printed circuits (also known as "printed circuit boards" or "printed wire boards") or that of passive elements, such as inductances, or electromechanics in integrated circuits or microsystems (also known as "microelectromechanical systems").

The current electronic systems are, for the majority, composed of several integrated circuits, or components, and each integrated circuit fulfills one or more functions. For example, a computer comprises at least one microprocessor and several memory circuits. Each integrated circuit usually corresponds to an electronic chip in its own package. Integrated circuits are brazed or plugged into, for example, a printed circuit board (or PCB) which ensures the connection between the integrated circuits.

The permanent need to increase the functionality density of electronic systems has led to the concept known as "three-dimensional integration" or "vertical integration", which is characterized in that the chips are superposed and connected together by vertical interconnections. The stack obtained thus comprises several layers or strata of active components or chips, and constitutes an integrated circuit in three dimensions (known as a 3D integrated circuit or "3D IC").

After stacking, for example by bonding, the chips may be individually connected to the terminals of the package via connecting wires. Interconnection of the chips generally calls upon the use of through wafer vias.

The basic technologies necessary for producing three-dimensional integrated circuits especially comprise slimming of the silicon wafers, alignment between the layers, bonding of the layers, etching and metallization of the through wafer vias in each layer.

The slimming-down of the silicon wafers may be performed before the manufacture of the through wafer vias (e.g. U.S. Pat. No. 7,060,624; U.S. Pat. No. 7,148,565).

Alternatively, the etching and metallization of the vias may be performed before slimming down the silicon wafer (e.g. U.S. Pat. No. 7,060,624; U.S. Pat. No. 7,101,792). In this case, closed or "blind" vias are etched in the silicon and then metallized down to the desired depth, before slimming down the silicon wafer, thus to obtain through wafer vias.

The good electrical conductivity of copper and its high resistance to electromigration, i.e. the low migration of the copper atoms under the effect of the electrical current density, which is liable to be a major cause of failure, make it in particular a material of choice for the metallization of through wafer vias.

The through wafer vias of 3D integrated circuits are generally made in a similar manner to the "Damascene process" used in the field of microelectronics for the manufacture of interconnection elements of integrated circuits, according to a sequence of steps comprising:
 etching of the vias in or through the silicon wafer;
 deposition of an insulating dielectric layer;
 deposition of a barrier layer or "liner" that serves to prevent the migration or diffusion of copper;
 deposition of a copper germination layer;
 filling of the vias by electrodeposition of copper; and
 removal of the excess copper by mechanochemical polishing.

The insulating dielectric layer may be inorganic (generally made of silicon dioxide $SiO_2$, silicon nitride SiN or aluminium oxide, for example), deposited by CVD or the like, or organic (parylene C, N or D, polyimide, benzocyclobutene or polybenzoxazole, for example) deposited by dipping in a liquid medium or SOG method (spin-on-glass).

The copper-diffusion barrier layer is generally made of tantalum (Ta), titanium (Ti), tantalum nitride (TaN), titanium nitride (TiN), titanium-tungsten alloy (TiW), tungsten nitride-carbide (WCN) or a combination of these materials, and is generally deposited in the vapour phase (PVD, CVD or ALD).

This barrier layer may be formed from other metals such as, in particular, an alloy based on nickel or cobalt via an electroless route.

Thus, patent application US 2005/0 110 149 describes a process for preparing a semiconductive device comprising a silica-based insulating intermediate layer covered with a monomolecular film based on an organic silane surface-modified with a compound containing palladium, the film thus modified being covered via an electroless process with a layer based on cobalt or based on nickel forming a barrier, on which a layer of copper may be deposited by electrodeposition.

A substantially similar process is described in patent application US 2008/0 079 154, which recommends, in order to improve the adhesion properties between the various layers of the semiconductive device, to perform two consecutive electroless treatments with a nickel-based compound (NiB) and then with a cobalt-based compound (CoWP).

The process described in these prior patent applications requires the use of two different solutions and two different treatments to fix onto the intermediate insulating surface the palladium compound serving as the activator for the electroless deposition.

In addition, these processes were developed for the manufacture of an interconnection system etched onto an insulating dielectric layer of inorganic nature.

The copper germination layer is generally made via physical or chemical deposition processes using a vapour phase. Given the drawbacks resulting from these techniques, intensive research has been conducted to provide novel compositions for producing a copper germination layer via an electrochemical route.

In this context, the present invention relates, in its currently preferred application, to the preparation of through wafer vias of three-dimensional integrated circuits in which the insulating dielectric layer is formed at least partly from an organic polymer and must be covered with a metallic layer via an electroless route. The aim of the present invention is to solve the technical problem that consists in providing a composition combining, within a single solution, all of the components for activating the polymer surface of a substrate, such as a semiconductive substrate bearing an insulating layer, for the purpose of its subsequent covering with a metallic layer deposited via an electroless route, and then with a copper germination layer, leading to multilayer structures with excellent adhesion between the layers.

Thus, according to a first aspect, one subject of the present invention is a solution for activating the surface of a substrate for the purpose of its subsequent covering with a metal layer deposited via an electroless route, said surface consisting exclusively of a polymer or comprising at least one area formed from a polymer and at least one area formed from an oxide, especially a silicon oxide, characterized in that it contains:

A) an activator formed from one or more palladium complex(es) chosen from the group formed by:

palladium complexes of formula (I)

in which:

R1 and R2 are identical and represent H; $CH_2CH_2NH_2$; $CH_2CH_2OH$;

or R1 represents H and R2 represents $CH_2CH_2NH_2$;

or R1 represents $CH_2CH_2NH_2$ and R2 represents $CH_2CH_2NHCH_2CH_2NR_2$;

or R1 represents H and R2 represents $CH_2CH_2NHCH_2CH_2NHCH_2CH_2NH_2$

X represents a ligand chosen from the group formed by $Cl^-$; $Br^-$; $I^-$; $H_2O$, $NO_3^-$; $CH_3SO_3^-$; $CF_3SO_3^-$; $CH_3$-Ph-$SO_3^-$; $CH_3COO^-$;

palladium complexes of formula IIa or IIb in which:

R1 and R2 are as defined above and

Y represents a counterion comprising two negative charges formed:

either from two monoanions, preferably chosen from the group formed by $Cl^-$; $PF_6^-$; $BF_4^-$; $NO_3^-$; $CH_3SO_3^-$; $CF_3SO_3^-$; $CH_3$—$C_6H_4$—$SO_3^-$; $CH_3COO^-$;

or from a dianion, preferably $SO_4^-$;

B) a binder formed from one or more organic compounds chosen from the group formed by compounds comprising at least two glycidyl functions and compounds comprising at least two isocyanate functions;

C) a solvent system formed from one or more solvents capable of dissolving said activator and said binder.

In the text hereinbelow, the compounds of formulae (IIa) and (IIb) may be collectively referred to as "compounds of formula (II)".

According to one particular characteristic of the invention, this solution comprises:

the activator in a concentration of from $10^{-6}$ M to $10^{-2}$ M, preferably from $10^{-5}$ M to $10^{-3}$ M and more preferably from $5 \times 10^{-5}$ M to $5 \times 10^{-4}$ M;

the binder in a concentration from $10^{-5}$ M to $10^{-1}$ M, preferably from $10^{-4}$ M to $10^{-2}$ M and more preferably from $5 \times 10^{-4}$ M to $5 \times 10^{-3}$ M.

In an entirely novel manner, the activator of the solution in accordance with the invention is formed from one or more palladium complexes corresponding to formulae (I) and (II) defined previously.

The complexes of formula (I) may be prepared by reaction between a palladium salt of formula (III) and a nitrogenous bidentate ligand of formula (IV) according to the following reaction scheme:

in which X, R1 and R2 have the meanings defined previously.

More specifically, a palladium salt of formula (III) is dissolved in an aqueous 0.2 M hydrochloric acid solution at a temperature of between 40° C. and 80° C., preferably about 60° C., for a period from 10 to 20 minutes, preferably about 20 minutes, to obtain the soluble complex of formula $H_2PdCl_4$.

At the end of the reaction, one equivalent of a nitrogenous bidentate ligand of formula (IV) is added to the reaction medium, which is maintained at a temperature of between 40° C. and 80° C., preferably about 60° C., for a period of 1 to 3 hours, preferably about 2 hours, to give the complex of formula (I). The addition of the ligand results in a colour change of the reaction medium.

The solvent is then evaporated off and the solid residue is treated by recrystallization in a solvent, for instance ethanol.

Preferentially, the starting palladium compound is palladium chloride $PdCl_2$.

Alternatively, the palladium salt of formula (Iii) may be replaced with a palladium salt of formula $[PdX_4]^{2-}$, such as $K_2PdCl_4$, $Li_2PdCl_4$, $Na_2PdCl_4$ or $(NH_4)_2PdCl_4$.

As preferred examples of amine derivatives of formula (IV) that may be used in the context of the present invention, mention will be made especially of the following compounds:

diethylenetriamine (compound of formula (IV) in which R1 represents a hydrogen atom and R2 represents a $CH_2CH_2NH_2$);

N,N'-bis(2-hydroxyethyl)ethylenediamine (compound of formula (IV) in which R1 and R2 are identical and represent $CH_2CH_2OH$).

An amine compound that is particularly preferred in the context of the present invention is diethylenetriamine.

The complexes of formula (II) may be prepared in a manner similar to the preparation of the complexes of formula (I) according to the following reaction scheme:

in which X, R1 and R2 have the meaning indicated previously.

More specifically, a soluble complex of formula $H_2PdCl_4$ is formed in an identical manner to that described previously.

At the end of the reaction, two equivalents of the nitrogenous bidentate ligand of formula (IV) are added to the reaction medium, which is maintained at a temperature of between 60° C. and 80° C. for a period of 8 to 15 hours, preferably about 12 hours, to give the complexes of formulae (IIa) and (IIb).

Alternatively, the complexes of formula (II) may be prepared from the complexes of formula (I) by adding one equivalent of the nitrogenous bidentate ligand in a suitable solvent and maintaining the reaction medium at a temperature of between 60° C. and 80° C., preferably about 70° C., for a period of 8 to 15 hours, preferably about 12 hours. In these two cases, the reaction may be facilitated by adding a silver salt to the reaction medium.

The reaction scheme given previously shows that the reaction leads to two cis and trans complexes, which are the only complexes formed in the case where R1 represents H and R2 represents $CH_2CH_2NH_2$. A person skilled in the art will easily understand that statistical mixtures of several complexes may be obtained in the case where R1 and R2 both represent radicals with a molecular mass greater than or equal to that of the group $CH_2CH_2NH_2$. It has been shown that such mixtures may be used at the industrial scale and do not necessarily need to be purified to give the desired result.

The binder, which is one of the essential components of the solution according to the invention, is formed from one or more organic compounds chosen from compounds comprising at least two glycidyl functions and compounds comprising at least two isocyanate functions.

This binder is intended to promote the attachment of palladium to the polymer surface to be activated.

As examples of organic compounds comprising at least two glycidyl functions that may be used in the context of the present invention, mention may be made of compounds chosen from the group formed by 1,4-butanediol diglycidyl ether, ethylene glycol diglycidyl ether, propylene glycol diglycidyl ether, diethylene glycol diglycidyl ether, 4,4'-bisphenol A-diglycidyl ether, glyceryl triglycidyl ether and triglycidyl isocyanurate.

A compound that is particularly preferred in the context of the present invention is 1,4-butanediol diglycidyl ether, also known as diglycidyl ether butane.

Compounds comprising two isocyanate functions may be chosen from the group formed by 1,2-phenylene diisocyanate; 1,3-phenylene diisocyanate; 1,4-phenylene diisocyanate; 1,4-diisocyanatobutane; 1,6-diisocyanatohexane; 1,8-diisocyanatooctane; 2,4-toluene diisocyanate; 2,5-toluene diisocyanate; 2,6-toluene diisocyanate; 3,3'-dimethoxy-4,4'-biphenylene diisocyanate; isophorone diisocyanate; m-xylylene diisocyanate; trans-1,4-cyclohexylene diisocyanate; 1,3-bis(1-isocyanato-1-methylethyl)benzene, 4,4-methylenebis(phenyl isocyanate).

The binder is generally present in the activation solution in a concentration of from $10^{-5}$ M to $10^{-1}$ M, preferably from $10^{-4}$ M to $10^{-2}$ M and more preferably from $5\times10^4$ M to $5\times10^{-3}$ M.

The solvent system for the solution in accordance with the present invention should be able to dissolve the activator and the binder defined previously.

This solvent system may be formed from one or more solvents chosen from the group formed by N-methylpyrrolidinone (NMP), dimethyl sulfoxide (DMSO), alcohols, ethylene glycol ethers, for instance monoethyl diethylene glycol, propylene glycol ethers, dioxane and toluene.

In general, the solvent system is advantageously formed from a mixture of a solvent that is capable of dissolving the palladium complex in combination with a solvent such as an ethylene glycol ether or a propylene glycol ether.

A solvent system that is particularly preferred in the context of the present invention, especially on account of its very low toxicity, is formed from a mixture of N-methylpyrrolidinone (NMP) and diethylene glycol monoethyl ether. These compounds may be used in a volume ratio of between 1:200 and 1:5, and preferably about 110.

According to one embodiment variant of the invention, which is especially useful in the case where the surface to be activated also comprises at least one area formed from an oxide, for instance $SiO_2$ in the case of a silicon-based semiconductive substrate, the solution according to the invention also comprises one (or more) organosilane compounds.

Specifically, it has been discovered that such a compound is necessary to allow good adhesion between successive layers of a substrate having a "mixed" structure, i.e. comprising at least one area thrilled from a polymer and at least one area formed from an oxide, in particular when this surface is subsequently covered with a metallic layer, especially of NiB forming a copper-diffusion barrier, which is itself covered with a copper germination layer.

It has also been shown that the presence of one (or more) such organosilane compounds in the activation solution according to the invention does not harm the adhesion of the layers in the areas of the surface of the substrate covered with polymer.

According to one particular characteristic of the invention, the organosilane compound corresponds:

to the general formula:

$\{X\text{-}(L)\}_{4-n}\text{-Si}(OR)_n$ (Va)

in which:

X represents a functional group chosen from the group formed from thiol, pyridyl, epoxy (oxacyclopropanyl), glycidyl, primary amine, chloro, and capable of reacting with the palladium compounds of formula I;

L represents a spacer arm chosen from the group formed by $CH_2$; $CH_2CH_2$; $CH_2CH_2CH_2$—; $CH_2CH_2CH_2CH_2$—; $CH_2CH_2NHCH_2CH_2$; $CH_2CH_2CH_2NHCH_2CH_2$; $CH_2CH_2CH_2NHCH_2CH_2NHCH_2CH_2$;

CH$_2$CH$_2$CH$_2$NHCH$_2$CH$_2$CH$_2$CH$_2$CH$_2$; Ph; Ph-CH$_2$; and CH$_2$CH$_2$-Ph-CH$_2$; (Ph representing a phenyl nucleus);

R is a group chosen from the group formed from CH$_3$, CH$_3$CH$_2$, CH$_3$CH$_2$CH$_2$ and (CH$_3$)$_2$CH; and n is an integer equal to 1, 2 or 3;

or to the general formula:

(OR)$_3$Si-(L)-Si(OR)$_3$   (Vb)

in which:

L represents a spacer arm chosen from the group formed from CH$_2$CH$_2$CH$_2$NHCH$_2$CH$_2$NHCH$_2$CH$_2$CH$_2$ and CH$_2$CH$_2$CH$_2$—S—S—CH$_2$CH$_2$CH$_2$ R is a group chosen from the group formed by CH$_3$, CH$_3$CH$_2$, CH$_3$CH$_2$CH$_2$ and (CH$_3$)$_2$CH.

Compounds of formula (Va) or (Vb) are chosen, for example, from the following compounds:

(3-aminopropyl)triethoxysilane;
(3-aminopropyl)trimethoxysilane;
m-aminopropyltrimethoxysilane;
p-aminopropyltrimethoxysilane;
p,m-aminophenyl trimethoxysilane;
4-aminobutyltriethoxysilane;
m,p-aminoethylaminomethyl)phenethyltrimethoxysilane;
N-(2-aminoethyl)-3-aminopropyl triethoxysilane;
N-(2-aminoethyl)-3-aminopropyl trimethoxysilane;
2(4-pyridylethyl)triethoxysilane;
bis(3-trimethoxysilylpropyl)ethylenediamine;
(3-trimethoxysilylpropyl)diethylenetriamine;
N-(3-trimethoxysilylethyl)ethylenediamine;
N-(6-aminohexyl)aminopropyltrimethoxysilane;
(3-glycidoxypropyl)trimethoxysilane;
(3-glycidoxypropyl)triethoxysilane;
5,6-epoxyhexyltriethoxysilane;
(3-mercaptopropyl)trimethoxysilane;
(3-mercaptopropyl)triethoxysilane;
bis[3-(triethoxysilyl)propyl]disulfide;
3-chloropropyltrimethoxysilane;
3-chloropropyltriethoxysilane;
(p-chloromethyl)phenyltrimethoxysilane;
m,p-((chloromethyl)phenylethyl)trimethoxysilane.

As preferred organosilane compounds that may be used in the context of the present invention, mention may be made especially of:

the compounds of formula (Va) in which:

X represents an NH$_2$ group and

L represents Cl$_2$CH$_2$CH$_2$— and R represents CH$_3$ (compound known as (3-aminopropyl)trimethoxysilane or APTMS);

or L represents CH$_2$CH$_2$CH$_2$— and R represents CH$_3$CH$_2$ (compound known as (3-aminopropyl)triethoxysilane or APTES);

or L represents CH$_2$CH$_2$NHCH$_2$CH$_2$ and R represents CH$_3$ (compound known as N-(2-aminoethyl)-3-aminopropyltrimethoxysilane or DATMS or DAMO);

X represents SH; L represents CH$_2$CH$_2$CH$_2$— and R represents CH$_2$—CH$_3$ (compound known as (3-mercaptopropyl)trimethoxysilane or MPTES);

or X represents C$_6$H$_5$N; L represents CH$_2$CH$_2$— and R represents CH$_2$—CH$_3$ (compound known as 2-(4-pyridylethyl)triethoxysilane or PETES);

or X represents CHCH$_2$O; L represents CH$_2$CH$_2$CH$_2$ and R represents CH$_3$ (compound known as (3-glycidoxypropyl)trimethoxysilane or EPTMS).

or X represents Cl; L represents CH$_2$CH$_2$CH$_2$ and R represents CH, (compound known as 3-chloropropyltrimethoxysilane or CPTMS).

An organosilane compound that is particularly preferred in the context of the present invention is (3-aminopropyl)trimethoxysilane (APTMS).

Advantageously, the concentration of the organosilane compound is generally between $10^{-5}$ M and $10^{-1}$ M, preferably between $10^{-4}$ M and $10^{-2}$ M and more preferably between $5 \times 10^{-4}$ M and $5 \times 10^{-3}$ M or between $10 \times 10^{-3}$ M and $10 \times 10^{-2}$ M.

According to one particularly advantageous characteristic, the activation solution comprises a very small amount of water. Thus, the water may be present in a concentration of less than 1%, preferably less than 0.5% and more preferably less than 0.2% by volume.

An activation solution that is particularly preferred in the context of the present invention contains:

an activator formed from one or more palladium complexes chosen from the group formed by:

complexes of formula (I), in which:

R1 represents H, R2 represents CH$_2$CH$_2$NH$_2$ and R represents Cl, this complex being known as (diethylenetriamine)(dichloro)palladate(II);

R1 and R2 are identical and represent CH$_2$CH$_2$OH and X represents Cl, this complex being known as (N,N'-bis(2-hydroxyethyl)-ethylenediamine)(dichloro)palladate(II);

complexes of formula (IIa) in which:

R1 represents H, R2 represents CH$_2$CH$_2$NH$_2$ and Y represents two Cl, this complex being known as trans-bis(diethylenetriamine)palladate(II);

complexes of formula (IIb) in which:

R1 represents H, R2 represents CH$_2$CH$_2$NH$_2$ and Y represents two Cl, this complex being known as cis-bis(diethylenetriamine)palladate(II); in a concentration of from $5 \times 10^{-5}$ M to $5 \times 10^{-4}$ M;

a binder formed from one or more organic compounds chosen from the group formed by 1,4-butanediol diglycidyl ether and 4,4'-bisphenol ether in a concentration of from $5 \times 10^{-4}$ M to $5 \times 10^{-3}$ M; and an organosilane compound chosen from the group formed from the compounds of formula (Va) in which X represents an NH$_2$ group and:

L represents CH$_2$CH$_2$CH$_2$— and R represents CH$_3$, this compound being known as (3-aminopropyl)trimethoxysilane or APTMS;

L represents CH$_2$CH$_2$CH$_2$— and R represents CH$_3$, this compound being known as (3-aminopropyl)triethoxysilane or APTMS;

L represents CH$_2$CH$_2$NHCH$_2$CH$_2$ and R represents CH$_3$, this compound being known as [3-(2-aminoethyl)aminopropyl]trimethoxysilane or DATMS or DAMO in a concentration of between $10^{-3}$ M and $10^{-2}$ M.

According to a second aspect, a subject of the present invention is the use of a solution as described previously for activating the surface of a substrate for the purpose of its subsequent covering with a metallic layer deposited via an electroless route, said surface being formed exclusively from a polymer or comprising at least one area formed from a polymer and at least one area formed from an oxide.

According to a first embodiment, the substrate whose surface may be activated by performing the present invention may be a flexible substrate, also known as a "flex", formed from a polymer with dielectric properties that is capable of withstanding harsh conditions such as high temperatures. These substrates are especially useful in the microelectronics sector, and more specifically for the manufacture of flexible printed circuits (FPC) or electronic connections between two pans of a telephone or a laptop.

These flexible substrates may be polymers such as polyimides (Kapton® and Upilex®), polyesters (Mylar®), polyamides (Nomex®) and polyetherimides (Ultem®).

According to a second currently preferred embodiment, the substrate whose surface may be activated by performing the present invention may be a silicon-based semiconductive substrate, in particular intended for the manufacture of an electronic device and more particularly through wafer vias for three-dimensional integrated circuits.

The polymer capable of forming at least partly the surface of the substrate may be chosen from polymers comprising one or more groups chosen from the group formed by primary amine; secondary amine; enamine; alcohol; thiol; aromatic heterocyclic (for instance pyridine, pyrrole or thiophene) and non-aromatic heterocyclic groups.

In the present invention, the term "heterocyclic group" means a saturated or partially unsaturated hydrocarbon-based group with 1 or 2 rings containing from 3 to 8 carbon atoms per ring, one or more carbon atoms of which (optionally associated with one or more hydrogen atoms) is (are) substituted with one or more heteroatoms chosen especially from oxygen, nitrogen and sulfur. Such a group may thus be aromatic or non-aromatic, and monocyclic or bicyclic.

As examples of monocyclic aromatic heterocyclic groups, mention may be made of pyridine, pyrrole, thiophene, pyrazole, imidazole and oxazole groups.

As examples of bicyclic heterocyclic groups, mention may be made of benzothiazole, benzoxazole, benzoxadiazole and indole groups.

As examples of non-aromatic heterocyclic groups, mention may be made of tetrahydrofuran, piperidine, morpholine and thiamorpholine groups.

According to one particular characteristic, the polymer is a polymer that may be deposited on the surface of the substrate by electrografting.

Electrografting is a wet deposition technique based on the initiation and then electro-induced polymerization, by chain propagation, of electro-active monomers on the surface to be covered.

In general, electrografting requires:
firstly, the use of a liquid solution containing an initiating compound and monomer; and
secondly, an electrochemical protocol for forming a polymer film at the surface of the substrate to be coated.

A process for preparing, an organic film by electrografting is described, for example, in international patent application WO 2007/099 137.

In the context of the present invention, a polymer film may be formed at the surface of an electrically conductive or semiconductive substrate, such as a silicon substrate, via a process comprising:

a) the placing in contact of said surface with a liquid solution comprising:
  a protic solvent, preferably water, more preferably deionized or distilled water;
  at least one diazonium salt;
  at least one chain-polymerizable monomer that is soluble in said protic solvent;
  at least one acid in an amount sufficient to stabilize said diazonium salt by adjusting the pH of said solution to a value of less than 7 and preferably less than 2.5;

b) polarization of said surface via a potentio- or galvano-pulsed mode for a time sufficient to form a film at least 20 nanometers thick and preferably between 100 and 500 nanometers thick.

In general, many diazonium salts may be used for performing this process and in particular the diazonium salts mentioned in WO 2007/099 218.

According to one preferred embodiment, the diazonium salt may be chosen from phenyldiazonium tetrafluoroborate, 4-nitrophenyldiazonium tetrafluoroborate, 4-bromophenyldiazonium tetrafluoroborate, 2-methyl-4-chlorophenyldiazonium chloride, 4-benzoylbenzenediazonium tetrafluoroborate, 4-cyanophenyldiazonim tetrafluoroborate, 4-carboxyphenyldiazonium tetrafluoroborate, 4-acetamidophenyldiazonium tetrafluoroborate, 4-phenylacetic acid diazonium tetrafluoroborate, 2-methyl-4-[(2-methylphenyl)diazenyl]benzene-diazonium sulfate, 9,10-dioxo-9,10-dihydro-1-anthracenediazonium chloride, 4-nitrophthalenediazonium tetrafluoroborate, naphthalenediazonium tetrafluoroborate and 4-aminophenyldiazonium chloride.

Preferentially, the diazonium salt is chosen from phenyldiazonium tetrafluoroborate and 4-nitrophenyldiazonium tetrafluoroborate.

The diazonium salt is generally present in the electrografting liquid solution in an amount of between $10^{-3}$ and $10^{-1}$ M and preferably between $5 \times 10^{-3}$ and $3 \times 10^{-2}$ M.

The monomers capable of forming the film at the surface of the substrate may be chosen from vinyl monomers that are soluble in the protic solvent and that correspond to the following general formula:

(VI)

in which the groups $R_1$ to $R_4$, which may be identical or different, represent a non-metallic monovalent atom such as a halogen atom or a hydrogen atom, or a saturated or unsaturated chemical group, such as a $C_1$-$C_6$ alkyl group, an aryl group, a group —COOR$_5$ in which $R_5$ represents a hydrogen atom or a $C_1$-$C_6$ alkyl, nitrile, carbonyl, amine or amide group.

Preferentially, water-soluble monomers will be used. Such monomers will advantageously be chosen from ethylenic monomers comprising pyridine groups, such as 4-vinylpyridine or 2-vinylpyridine, or from ethylenic monomers comprising carboxylic groups such as acrylic acid, methacrylic acid, itaconic acid, maleic acid or fumaric acid, and the sodium, potassium, ammoniacal or amine salts thereof, amides of these carboxylic acids and in particular acrylamide and methacrylamide, and also the N-substituted derivatives thereof, esters thereof such as 2-hydroxyethyl methacrylate, glycidyl methacrylate, dimethyl or diethyl amino (ethyl or propyl) (meth)acrylate and salts thereof, quaternized derivatives of these cationic esters, for instance acryloxyethyltrimethylammonium chloride. 2-acrylamido-2-methylpropanesulfonic acid (AMPS), vinylsulfonic acid, vinylphosphoric acid, vinyllactic acid and salts thereof, acrylonitrile, N-vinylpyrrolidone, vinyl acetate, N-vinylimidazoline and derivatives thereof, N-vinylimidazole and derivatives of the diallylammonium type, for instance dimethyldiallylammonium chloride, dimethyldiallylammonium bromide or diethyldiallylammonium chloride.

A monomer that is particularly preferred in the context of the present invention is 4-vinylpyridine.

The quantitative composition of the electrografting liquid solution may vary within a wide range.

In general, this solution comprises:
  at least 0.3 M of polymerizable monomer(s),
  at least $5 \times 10^{-3}$ M of diazonium salt(s)
the mole ratio between the polymerizable monomer(s) and the diazonium salt(s) being between 10 and 300.

In the case of the preferred application of the invention to the manufacture of three-dimensional integrated circuits, the use of an electrografting protocol in pulsed mode is advantageously used so as to obtain a continuous, uniform film with growth kinetics that are compatible with the industrial constraints.

In general, polymerization of the surface to be covered with the film is performed in a pulsed mode, each cycle of which is characterized by:
  a total period P of between 0.010 s and 2 s and preferably of about 0.11 s;
  a polarization time Ton of between 0.01 and 1 s and preferably of about 0.02 s, during which a potential difference or a current is imposed at the surface of the substrate; and
  a rest time at zero potential or current of a duration of between 0.01 and 1 s and preferably of about 0.09 s.

According to a third aspect, a subject of the present invention is a process for activating the surface of a substrate so as to subsequently cover it with a metallic layer deposited via an electroless route, said surface being formed exclusively from a polymer or comprising at least one area formed from a polymer and at least one area formed from an oxide, especially a silicon oxide, characterized in that it consists in placing said surface of the substrate in contact with a solution as defined previously.

Preferably, this activation process is performed at a temperature of between 50 and 90° C., for a duration of from 1 to 30 minutes and more preferably at a temperature of between 65 and 70° C. for a duration of 5 to 15 minutes.

The placing in contact of the surface of the substrate with the activation solution in accordance with the present invention is advantageously performed by immersing the polymer-coated substrate in the activation solution.

Finally, according to a fourth aspect, a subject of the present invention is a process for manufacturing an electronic device, comprising the steps consisting in:
  a) activating the surface of a substrate such as, in particular, a silicon-based substrate, said surface being formed exclusively from a polymer or comprising at least one area formed from a polymer and at least one area formed from an oxide, especially a silicon oxide, by placing said surface in contact with a solution as defined previously, preferably at a temperature of between 50 and 90° C., for a period of from 1 to 30 minutes and more preferably at a temperature of between 65 and 70° C. for a period of 5 to 15 minutes; and
  b) coating said surface thus activated by deposition, via an electroless route, of a metallic layer, especially based on nickel.

Such a process is particularly useful for the manufacture of through wafer vias for three-dimensional integrated circuits in which the surface of an electrically conductive or semiconductive substrate is successively coated, at least partially, with a first inner layer of an electrically insulating film-forming polymer, with a metallic intermediate layer forming a copper-diffusion barrier, and with a copper germination outer layer.

The process in accordance with this further aspect of the invention may use any metal that can be deposited via an electroless route onto the activated surface of the substrate.

For the preferred applications of the invention, a metal chosen from noble metals and transition metals, and alloys thereof, will preferably be used. These metals may be alloyed with elements such as phosphorus or boron or a mixture of these compounds.

Such materials, and in particular materials based on nickel or cobalt, constitute barrier layers that are particularly advantageous for preventing the migration or diffusion of copper.

Excellent results were obtained in the context of the present invention with nickel alloyed with boron.

The deposition of a metallic layer via an electroless route is a process that is well known to those skilled in the art.

In the context of the present invention, the coating of the activated surface of the substrate is performed by placing this surface in contact with a liquid solution, which is preferably aqueous, containing:
  at least one metal salt, preferably in a concentration of between $10^{-3}$ M and 1 M;
  at least one reducing agent, preferably in an amount of between $10^{-4}$ M and 1 M;
  optionally, at least one stabilizer, preferably in an amount of between $10^{-3}$ M and 1 M; and
  an agent for adjusting the pH to a value of between 6 and 11 and preferably between 8 and 10;
under conditions for forming a metallic film at least 30 nanometers thick, preferably between 30 nanometers and 100 micrometers thick and more preferably between 70 nanometers and 200 nanometers thick.

Advantageously, the metal salt of the metal is a water-soluble salt chosen from the group rimmed by the acetate, acetylacetonate, hexafluorophosphate, nitrate, perchlorate, sulfate or tetrafluoroborate of said metal.

In the context of the present invention, a preferred metal salt is nickel sulfate hexahydrate.

Advantageously, the reducing agent may be chosen from the group formed by hypophosphorous acid and salts thereof, borane derivatives, glucose, formaldehyde and hydrazine.

In the context of the present invention, a preferred reducing agent is a borane derivative such as, in particular, dimethylaminoborane (DMAB).

The stabilizer may be chosen from the group formed by ethylenediamine, citric acid, acetic acid, succinic acid, malonic acid, aminoacetic acid, malic acid or an alkali metal salt of these compounds.

In the context of the present invention, a preferred stabilizer is citric acid.

In general, the metal layer may be made by dipping into the liquid solution defined previously, at a temperature of between 40 and 90° C., preferably at 70° C., for a period of 30 s to 20 min, depending on the desired thickness of the layer.

According to one advantageous embodiment, this layer may be annealed at a temperature of between 200 and 400° C., preferably at 250° C., for a duration of between 1 mm and 30 min, preferably about 10 min, under an inert or reductive atmosphere.

In the context of the preferred applications of the invention, the process that has just been described will be completed by a step for forming an additional copper germination layer.

Advantageously, the copper germination layer may be made via a wet electrodeposition process comprising:
  a) the placing in contact of the metal surface of the substrate with a liquid solution comprising:
    at least one solvent;
    copper ions in a concentration of between 14 and 120 mM and preferably between 16 and 64 mM;
    ethylenediamine;
    the mole ratio between the ethylenediamine and the copper being between 1.80 and 2.03;
    the pH of said composition being between 6.6 and 7.5;
  b) polarization of said surface for a time sufficient to form said copper germination layer.

According to one preferred embodiment, this liquid solution comprises copper ions in a concentration of between 16 and 64 mM, the mole ratio between the copper ions and the ethylenediamine preferably being between 1.96 and 2.00.

Although there is no restriction in principle on the nature of the solvent (provided that it sufficiently dissolves the active species of the solution and does not interfere with the electrodeposition), it will preferably be water.

In general, the source of copper ions is a copper salt such as, in particular, copper sulfate, copper chloride, copper nitrate, copper acetate, preferably copper sulfate and more preferably copper sulfate pentahydrate.

According to one preferred embodiment, the placing in contact of the surface to be coated with the liquid solution is performed without electrical polarization, i.e. without imposing an electrical current or an electrical potential relative to a counterelectrode or relative to a reference electrode on this surface, prior to the electrodeposition step.

There is no restriction in principle on the step for separation of the substrate coated with the copper germination layer after the foliation of the coating.

In this process, the step for foil ling the coating by electrodeposition is performed for a time sufficient to form the desired coating. This time may be readily determined by a person skilled in the art, the growth of the film being dependent on the charge, which is equal to the temporal integral of the electrical current passed through the circuit during the deposition time (Faraday law).

During the coating formation step, the surface to be coated may be polarized, either in galvanostatic mode (fixed imposed current) or in potentiostatic mode (fixed imposed potential, optionally relative to a reference electrode), or alternatively in pulsed mode (pulsed current or pulsed voltage).

In general, it has been observed that a particularly satisfactory coating may be obtained by polarization in pulsed mode, preferably so as to impose current gaps.

In general, this step may be performed by imposing current gaps corresponding to a maximum current per unit area in a range from 0.6 mA·cm$^{-2}$ to 10 mA·cm$^{-2}$ and more particularly from 1 mA·cm$^{-2}$ to 5 mA·cm$^{-2}$ and a minimum current per unit area in a range from 0 mA·cm$^{-2}$ to 5 mA·cm$^{-2}$ and preferably 0 mA·cm$^{-2}$.

More particularly, the duration of polarization at the maximum current may be between $2\times10^{-3}$ and 1.6 seconds and preferably between 0.1 and 0.8 second, for example about 0.36 second, whereas the duration of polarization at the minimum current may be between $2\times10^{-3}$ and 1.6 seconds, and preferably between 0.1 and 0.8 second, for example about 0.24 second.

The number of cycles to be performed during this step depends on the desired thickness of the coating.

In general, a person skilled in the art will easily determine the number of cycles to be performed, given that, under the preferential conditions, it has been observed that the deposition rate is about 0.3 nm per second.

This process made it possible to produce copper germination layers with a thickness of between 50 nm and 1 μm, preferably between 200 and 800 nm, for example about 300 nm, on the metal surface forming a copper-diffusion barrier in a structure of "through wafer via" type.

The invention will be understood more clearly on reading the description of the non-limiting examples that follow which is given with reference to the attached figures, which represent, respectively.

The examples that follow were performed at the laboratory scale.

Unless otherwise indicated, these examples were performed under standard temperature and pressure conditions (about 25° C. under about 1 atm) in ambient air, and the reagents used were obtained directly commercially without further purification.

EXAMPLE 1

Activation for an Electroless Deposition of a Substrate Coated with a Layer of Poly-4-Vinylpyridine Using a Solution According to the Invention Containing a Palladium Complex and a Compound Containing Two Glycidyl Functions a) Preparation of a Silicon-Based Substrate with a Surface Formed from a 4-Vinylpyridine Polymer:

a1) Substrate:

In this example, a P-doped silicon coupon with a side length of 4 cm (4×4 cm) and a thickness of 750 μm, with a resistivity of 20 Ω·cm, was used as substrate. This substrate had at the surface a relatively thin layer (less than 4 nm) of native oxide.

The substrate was cleaned with hydrofluoric acid (2.5% v/v) for 10 to 20 seconds.

a2) Deposition of a Layer of Poly-4-Vinylpyridine (P4VP) onto the Surface of the Substrate by Electrografting:

Electrografting Solution

The electrografting solution used in this example was an aqueous solution prepared by introducing 5 ml of 4-vinylpyridine (4-VP; $4.5\times10^{2}$ mol) in 95 ml of 1M HCl, followed by adding to the mixture thus made 236 mg of 4-nitrobenzenediazonium tetrafluoroborate (DNO$_2$; $1\times10^{-3}$ mol).

Protocol:

To perform the electrografting on the silicon substrate a system was used composed of:

- a sample holder equipped with means for rotating at a predetermined speed and configured to support the substrate, the assembly thus made being intended to serve as working electrode;
- a sheet of carbon or platinum intended to serve as counter-electrode;
- a stabilized electrical supply and a device for placing in electrical contact;
- a light source (halogen lamp, 150 W) placed in front of the substrate and equipped with filter(s), so as to obtain a light intensity on the surface of the substrate of between 2000 and 6000 lux (4000 lux in this case). The lamp was placed for this purpose about 10 cm from the surface of the sample. The substrate was illuminated throughout the experiment.

The electrografting of P4VP onto the surface of the silicon substrate was performed by imposing on the substrate, placed in rotation beforehand at a speed of 10 to 200 rpm (50 rpm in the example), a "potentio-pulsed" electrochemical protocol for a predetermined time of about 4 to 30 minutes (10 minutes in the example).

Figure 1:
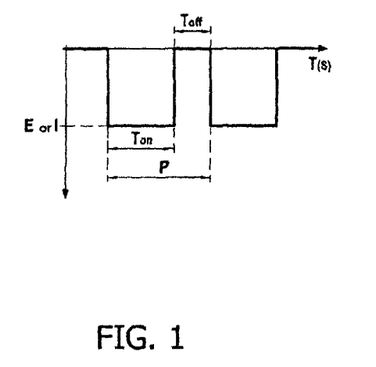
FIG. 1: Schematic representation of a pulsed electrografting protocol that may be used for the formation of a polymer film at the surface of a substrate.

FIG. 1 illustrates the electrochemical protocol that was used, with:
- a total period P of 0.11 second;
- a polarization time Ton of 0.02 second during which a cathode potential difference of −15 V is applied; and
- a resting time at zero potential, written as "Toff", of a duration of 0.09 second.

The duration of the electrografting step depends, as may be understood, on the desired thickness of the insulating polymer layer. This duration may be determined by a person skilled in the art, the growth of the layer being dependent on the applied potential difference, the light intensity and the Ton and Toff values.

Under the abovementioned conditions, a layer of polymer (P4VP) 200 nanometers thick was obtained.

Once the electrografting was complete, the polymer-coated substrate was rinsed several nines with water and then with dimethylformamide (DMF), followed by drying under a stream of nitrogen.

b) Activation of the Surface of the Substrate:

b1) Preparation of the Palladium Complex:

802 mg (4.52 mmol) of palladium chloride $PdCl_2$, 50 ml of deionized water and 1 ml of concentrated hydrochloric acid (37%, d=1.17), i.e. an acid concentration of 0.2 M, were placed in a 250 ml one-necked round-bottomed flask. The mixture was heated at 60° C. for a time of 20 minutes in order to dissolve the palladium chloride and thus to obtain a red-brown solution of $H_2PdCl_4$.

0.500 ml (4.58 mmol) of diethylenetriamine was added to the solution thus obtained. This addition caused a colour change of the solution from red-brown to orange-yellow.

The reaction medium was maintained at 60° C. for a further 2 hours.

The solvent was evaporated of on a rotary evaporator. The remaining solid was recrystallized from hot ethanol to give 1.268 g of a palladium complex of formula $C_4H_{13}N_3PdCl_2$ in the form of yellowish needles (yield=88%), $^1H$ NMR ($D_2O$): 2.62 (ddd, 2H); 2.82-2.94 (m, 4H); 3.02 (td, 2H).

b2) Preparation of the Activation Solution According to the Invention:

8 mg of the complex obtained in step hi) were dissolved in 10 ml, of N-methylpyrrolidinone (NMP).

50 ml of diethylene glycol monoethyl ether, 10 ml of the NMP solution containing the palladium complex and 0.345 ml of diglycidyl ether butane were introduced into a clean, dry flask. The whole was mixed by stirring.

b3) Treatment of the Surface of the Substrate:

The mixture obtained from the step b2) was brought to about 65° C. and the substrate prepared in step a) described previously was immersed therein for about 10 minutes. The substrate thus treated was then rinsed thoroughly with deionized water and dried under a stream of nitrogen.

c) Deposition of a Metallic Layer of NiB via an Electroless Route c1) Extemporaneous Preparation of the Electroless Solution:

31.11 g of nickel sulfate hexahydrate (0.118 mol), 44.67 g of citric acid (0.232 mol) and 58 g of N-methylethanolamine (0.772 mol) were successively placed in a 1 liter container. The final pH was adjusted to 9 with the base and the total volume was adjusted to 1 liter with distilled water. The solution was stabilized with 0.111 g of thiodiglycolic acid (0.739 mmol).

To nine volumes of the solution, just before its use in the following step, was added one volume of a reductive solution comprising 28 g/l of dimethylaminoborane (DMAB; 0.475 mol).

c2) Formation of a Metallic Layer of NiB for Forming a Diffusion Barrier:

A metallic layer of NIB was prepared on the "activated" surface of the substrate obtained after step b) by dipping in the electroless solution prepared previously and heated to 70° C., for a duration of between 30 seconds and 20 minutes, depending on the desired thickness. In this example, the dipping time was 4 minutes to obtain a metallic layer thickness of 70 nm.

The metallic layer thus obtained was annealed at 250° C. for 10 minutes under a reductive atmosphere ($N_2+H_2$ mixture (5% $H_2$)).

d) Formation of a Copper Germination Layer:

Solution:

The deposition of a copper germination layer onto the coated substrate after step c) was performed using an aqueous electrodeposition solution containing 2.1 ml·l$^{-1}$ (32 mM) of ethylenediamine and 4 g·l$^{-1}$ (16 mM) of $CuSO_4(H_2O)_5$.

Protocol:

The electrodeposition process used in this example comprised a copper growth step during which the treated substrate obtained after step c) was cathodically polarized in galvano-pulsed mode and simultaneously spun at a speed of 40 revolutions per minute.

Figure 2:
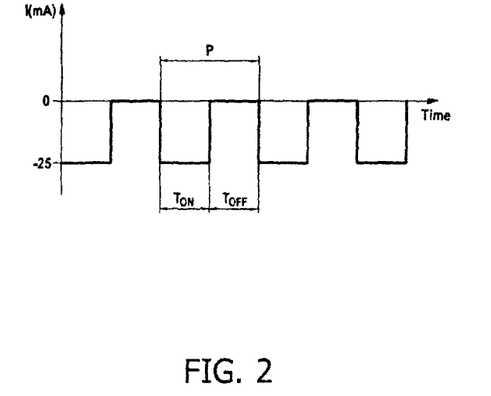
FIG. 2: Schematic representation of a galvano-pulsed protocol that may be used for the formation of a copper germination layer.

FIG. 2 describes in detail the galvano-pulsed protocol that was used, with a total period P of 0.6 s; a polarization time Ton of 0.36 s during which a current per unit area of 2.77 mA·cm$^2$ was applied; a resting time Toff without polarization of 0.24 s. The duration of this step depends, as may be appreciated, on the desired thickness of the germination layer. This duration may be readily determined by a person skilled in the art, since the growth of the film is dependent on the charge passed through the circuit. Under the abovementioned conditions, with a deposition rate of about 1.5 nm per coulomb of charge passed through the circuit, a duration of the electrodeposition step of about 15 minutes made it possible to obtain a coating 300 nm thick.

The substrate thus coated with copper was removed from the electrodeposition solution at zero spin speed in about 2 seconds and then rinsed with deionized water and dried under a stream of nitrogen.

e) Characterization of the Treated Substrate:

The coated substrate obtained after step d) described previously was characterized by scanning electron microscopy (SEM).

Figure 3:
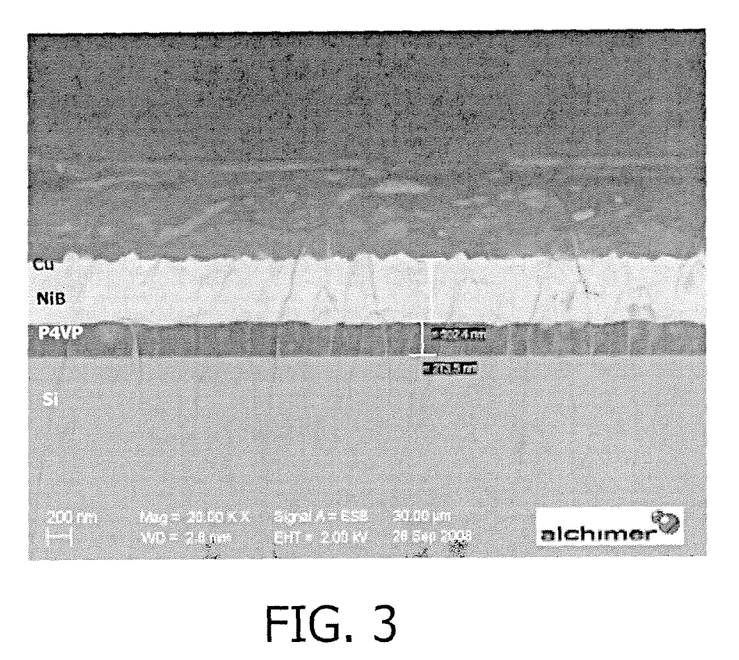
FIG. 3: Scanning electron microscopy of an Si—P4VP—NiB—Cu stack obtained in Example 1.

FIG. 3 is a view in cross section of the Si/P4VP/NiB/Cu stack obtained according to Example 1.

Adhesion Measurement:

The adhesion values in J/m$^2$ were measured using a synergy 100 MTS tensile testing machine (Cofrac). The tensile testing machine is connected to a force sensor moving vertically along a crossbar. The measuring ranges are between 1 and 20 J/m$^2$.

Results:

The adhesion measured according to this test is greater than 20 J/m$^2$, characterizing a total absence of delamination of the layers after the tensile test.

COMPARATIVE EXAMPLE 2

Activation, for an Electroless Deposition of Nickel, of a Substrate Coated with a Layer of Poly-4-Vinylpyridine Using a Solution Containing a Palladium Salt $PdCl_2$ Dissolved in an Acidic Medium (HCl)

For comparative purposes, Example 1 was repeated using an activation solution obtained from a commercial palladium salt without addition of diglycidyl ether butane.

More specifically, the activation solution was prepared by dissolving 17.3 mg ($10^{-4}$ mol) of $PdCl_2$ into one liter of a $10^{-2}$ M hydrochloric acid solution. A $10^{-4}$ M solution of $H_2PdCl_4$ was thus obtained. The substrate prepared in an identical manner to step b) of Example 1 was dipped into this solution, at room temperature, for two minutes. It was then rinsed thoroughly with deionized water and dried under a stream of nitrogen.

The coated substrate (Si/P4VP/NiB/Cu) obtained according to this comparative example was characterized using the adhesion measurement test described in Example 1.

This substrate had an adhesion of 11 $J/m^2$, this adhesion being markedly lower than that obtained with the solution according to the invention (Example 1).

COMPARATIVE EXAMPLE 3

Activation, for an Electroless Deposition of Nickel, of a Substrate Coated with a Layer of Poly-4-Vinylpyridine Using a Solution Containing a Palladium Complex Free of Compound Comprising at Least Two Glycidyl Functions In order to demonstrate the importance of the compound comprising at least two glycidyl functions in the activation solution according to the invention, Example 1 was repeated using an identical activation solution, except that it did not comprise the compound containing two glycidyl functions (Example 1 b2).

The coated substrate (Si/P4VP/NiB/Cu) obtained according to this comparative example was characterized using the adhesion measurement test described in Example 1e.

This substrate had an adhesion of 15 $J/m^2$, which is less than the adhesion obtained with the solution according to the invention (Example 1).

EXAMPLE 4

Activation, for an Electroless Deposition of Nickel, of a Substrate Coated with a Layer of Oxide ($SiO_2$) Using a Solution According to the Invention Containing a Palladium Complex, a Compound Comprising at Least Two Glycidyl Functions and an Organosilane For the purpose of applications that may involve "mixed" structures, i.e. substrates whose surface comprises at least one area formed from a polymer and at least one area formed from an oxide such as silicon oxide, the activation solution described in Example 1b2 was modified by adding an organosilane compound thereto.

In order to check that the addition of such an organosilane compound was compatible with the use of a composition according to the invention containing a palladium complex and a compound comprising at least two glycidyl functions, adhesion tests were thus performed on $SiO_2$ surfaces using this novel activation solution.

To this end, Example 1b2 was repeated using the same activation solution, to which was added 0.6 ml of aminopropyltrimethoxysilane (APTMS).

The substrate used in this example was a P-doped silicon coupon with a side length of 4 cm (4×4 cm) and a thickness of 750 μm, coated with a layer of silicon oxide 200 nm thick. The starting substrate was cleaned in an $H_2O_2/H_2SO_4$ mixture (2:5 v/v) at 70° C. for 45 minutes, and then in deionized water at 70° C. for 45 minutes, before being rinsed thoroughly with deionized water and dried under nitrogen before use.

The coated substrate ($SiO_2$/P4VP/NiB/Cu) obtained according to this example was characterized using the adhesion measurement test described in Example 1.

This substrate had an adhesion of greater than 20 $J/m^2$, which is comparable with the adhesion measured in Example 1e.

The stack obtained was also characterized by scanning electron microscopy (SEM).

Figure 4:
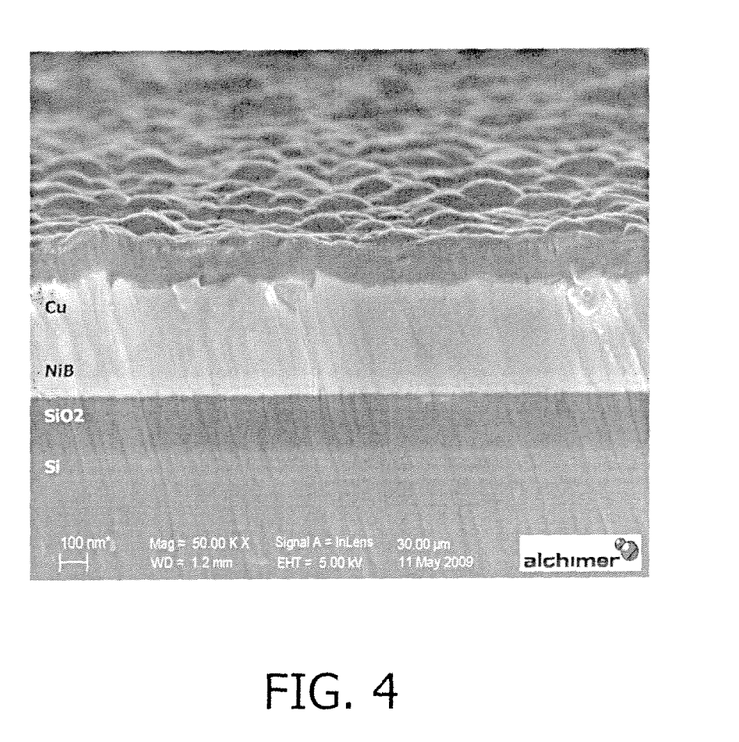
FIG. 4: Scanning electron microscopy of an Si—P4VP—NiB—Cu stack obtained in Example 4.

A view in cross section of this stack is thus reproduced in FIG. 4.

COMPARATIVE EXAMPLE 5

Activation, for an Electroless Deposition of Nickel, of an $SiO_2$ Surface Using a Solution Containing a Palladium Complex and a Compound Comprising at Least Two Glycidyl Functions In order to demonstrate the importance of the organosilane compound in the activation solution for the electroless covering of a surface formed partly from an oxide such as $SiO_2$, an additional experiment was performed using the activation solution described in Example 1.

To this end, Example 1b2 was repeated using the same activation solution.

The substrate used in this example was a P-doped silicon coupon with a side length of 4 cm (4×4 cm) and a thickness of 750 μm, coated with a layer of silicon oxide 200 nm thick. The starting substrate was cleaned in an $H_2O/H_2SO_4$ mixture (2:5 v/v) at 70° C. for 45 minutes, and then in deionized water at 70° C. for 45 minutes, before being rinsed thoroughly with distilled water and dried under nitrogen before use.

The coated substrate ($SiO_2$/P4VP/NiB/Cu) obtained according to this example was characterized using the adhesion measurement test described in Example 1e.

This substrate had an adhesion of 1 $J/m^2$, this adhesion being markedly lower than that obtained with the solution according to the invention (Example 4).

EXAMPLE 6

Activation, for an Electroless Deposition of Nickel, of a Substrate Coated with a Layer of Polymer (NAT) Using a Solution Containing a Palladium Complex, a Compound Comprising at Least Two Glycidyl Functions and an Organosilane In order to check that the addition of an organosilane compound was compatible with the use of a composition according to the invention containing a palladium complex and a compound comprising at least two glycidyl functions, adhesion tests were also performed on surfaces formed from a polymer such as an electrografted P4VP polymer.

To this end, Example 1 was repeated using the activation solution prepared in Example 4, containing an organosilane compound.

The coated substrate (Si/P4VP/NiB/Cu) obtained according to this example was characterized using the adhesion measurement test described in Example 1e.

This substrate had an adhesion of greater than 20 J/m$^2$, comparable with the adhesion measured in Example 1.

The presence of the organosilane compound in the activation solution therefore does not degrade the adhesion of the metallic layer on the polymer.

Table 1 below collates the results of the adhesion measurements for the substrates coated by performing Examples 1 to 6.

TABLE 1

| Ex. | Substrate surface | Activation solution | Adhesion (J · m$^2$) |
|---|---|---|---|
| 1 | P4VP | Complex + Diglycidyl | >20 |
| 2 | P4VP | Pd/H+ | 11 |
| 3 | P4VP | Complex | 15 |
| 4 | SiO$_2$ | Diglycidyl + Complex + Silane | >20 |
| 5 | SiO$_2$ | Diglycidyl + Complex | 1 |
| 6 | P4VP | Diglycidyl + Complex + Silane | >20 |

EXAMPLE 7

Activation, for an Electroless Deposition, of a Flexible Substrate of Polyimide Type (Kapton®) Using a Solution According to the Invention Containing a Palladium Complex, a Compound Comprising at Least Two Glycidyl Functions and a Compound of Aminosilane Type a) Cleaning of the Surfaces In this example, the flexible substrates of polyimide type are used directly without prior cleaning.

b) Activation of the Substrate Surface:

The activation solution was identical to that used in Example 6.

c) Deposition of a Metallic Layer of NiB via an Electroless Route

The deposition of the layer of NiB was performed in an identical manner to that of Example 1.

d) Formation of a Copper Germination Layer:

The deposition of the copper germination layer was performed in the same manner as in Example 1.

Results:

The adhesion measured according to this example was greater than 20 J/m$^2$, characterizing a total absence of delamination of the layers after the tensile test. No precipitate was observed in the activation solution.

The invention claimed is:

1. Solution for activating the surface of a substrate for the purpose of its subsequent covering with a metal layer deposited via an electroless route, said surface consisting exclusively of a polymer or comprising at least one area formed from a polymer and at least one area formed from an oxide, wherein the solution comprises:

A) an activator formed from one or more palladium complex(es) selected from the group consisting of:
palladium complexes of formula (I)

$$R1-N\underset{X}{\overset{\diagup\diagdown}{\underset{Pd}{\diagdown}}}\overset{\diagup\diagdown}{\underset{X}{N}}-R2 \quad (I)$$

in which:
R1 and R2 are identical and represent H; CH$_2$CH$_2$NH$_2$; CH$_2$CH$_2$OH;
or R1 represents H and R2 represents CH$_2$CH$_2$NH$_2$;
or R1 represents CH$_2$CH$_2$NH$_2$ and R2 represents CH$_2$CH$_2$NHCH$_2$CH$_2$NH$_2$;
or R1 represents H and R2 represents CH$_2$CH$_2$NHCH$_2$CH$_2$NHCH$_2$CH$_2$NH$_2$;
X represents a ligand selected from the group consisting of Cl$^-$; Br$^-$; I$^-$; H$_2$O, NO$_3$$^-$; CH$_3$SO$_3$$^-$; CF$_3$SO$_3$$^-$; CH$_3$-Ph-SO$_3$$^-$ and CH$_3$COO$^-$; and
palladium complexes of formula IIa or IIb $$\left[R1-N\underset{R2-N}{\overset{\diagup\diagdown}{\underset{Pd}{\diagdown}}}\overset{\diagup\diagdown}{\underset{N-R1}{N-R2}}\right]^{2+} Y^{2-} \quad (IIa)$$

$$\left[R1-N\underset{R1-N}{\overset{\diagup\diagdown}{\underset{Pd}{\diagdown}}}\overset{\diagup\diagdown}{\underset{N-R2}{N-R2}}\right]^{2+} Y^{2-} \quad (IIb)$$

in which:
R1 and R2 are as defined above and
Y represents a counterion comprising two negative charges formed:
either from two monoanions;
or from a dianion;
B) a binder formed from one or more organic compounds selected from the group consisting of compounds comprising at least two glycidyl functions and compounds comprising at least two isocyanate functions; and
C) a solvent system formed from one or more solvents capable of dissolving said activator and said binder.

2. Solution according to claim 1, comprising:
the activator in a concentration of from 10$^{-6}$ M to 10$^{-2}$ M; and
the binder in a concentration of from 10$^{-5}$ M to 10$^{-1}$ M.

3. Solution according to claim 1, wherein the binder is formed from one or more organic compounds selected from the group consisting of:
compounds comprising at least two glycidyl functions selected from the group consisting of 1,4-butanediol diglycidyl ether, ethylene glycol diglycidyl ether, propylene glycol diglycidyl ether, diethylene glycol diglycidyl ether, 4,4'-bisphenol A-diglycidyl ether, glyceryl triglycidyl ether and triglycidyl isocyanurate; and compounds comprising two isocyanate functions selected from the group consisting of 1,2-phenylene diisocyanate; 1,3-phenylene diisocyanate; 1,4-phenylene diisocyanate; 1,4-diisocyanatobutane; 1,6-diisocyanatohexane; 1,8-diisocyanatooctane; 2,4-toluene diisocyanate; 2,5-toluene diisocyanate; 2,6-toluene diisocyanate; 3,3'-dimethoxy-4,4'-biphenylene diisocyanate; isophorone diisocyanate; m-xylylene diisocyanate; trans-1,4-cyclohexylene diisocyanate; 1,3-bis(1-isocyanato-1-methylethyl)benzene and 4,4'-methylenebis(phenyl isocyanate).

4. Solution according to claim 1, wherein the solvent system is formed from one or more solvents selected from the group consisting of N-methylpyrrolidinone (NMP), dimethyl sulfoxide (DMSO), alcohols, ethylene glycol ethers, propylene glycol ethers, dioxane and toluene.

5. Solution according to claim 1, wherein, in the case where the surface to be activated comprises at least one area formed from an oxide, said solution also comprises:
D) one or more organosilane compound(s).

6. Solution according to claim 5, wherein the organosilane compound corresponds:
to the general formula:

$${X-(L)}_{4-n}-Si(OR)_n \quad (Va)$$

in which:
X represents a functional group selected from the group consisting of thiol, pyridyl, epoxy (oxacyclopropanyl), glycidyl, primary amine and chloro, and capable of reacting with the palladium compounds of formula I;
L represents a spacer arm selected from the group consisting of $CH_2$; $CH_2CH_2$; $CH_2CH_2CH_2$—; $CH_2CH_2CH_2CH_2$—; $CH_2CH_2NHCH_2CH_2$; $CH_2CH_2CH_2NHCH_2CH_2$; $CH_2CH_2CH_2NHCH_2CH_2NHCH_2CH_2$; $CH_2CH_2CH_2NHCH_2CH_2CH_2CH_2CH_2$; Ph; Ph-$CH_2$; and $CH_2CH_2$-Ph-$CH_2$;
R is a group selected from the group consisting of $CH_3$, $CH_3CH_2$, $CH_3CH_2CH_2$ and $(CH_3)_2CH$; and
n is an integer equal to 1, 2 or 3;
or to the general formula:

$$(OR)_3Si-(L)-Si(OR)_3 \quad (Vb)$$

in which:
L represents a spacer arm selected from the group consisting of $CH_2CH_2CH_2NHCH_2CH_2NHCH_2CH_2CH_2$ and $CH_2CH_2CH_2$—S—S—$CH_2CH_2CH_2$ and
R is a group chosen selected from the group formed by consisting of $CH_3$, $CH_3CH_2$, $CH_3CH_2CH_2$ and $(CH_3)_2CH$.

7. Solution according to claim 5, wherein the concentration of the organosilane compound is between $10^{-5}$ M and $10^{-1}$ M.

8. Solution according to claim 5, wherein the organosilane compound(s) is (are) chosen selected from the group consisting of:
the compounds of formula (Va) in which:
X represents an $NH_2$ group and
L represents $CH_2CH_2CH_2$— and R represents $CH_3$ (compound known as (3-aminopropyl)trimethoxysilane or APTMS);
or L represents $CH_2CH_2CH_2$— and R represents $CH_3CH_2$ (compound known as (3-aminopropyl)triethoxysilane or APTES);
or L represents $CH_2CH_2NHCH_2CH_2$ and R represents $CH_3$ (compound known as N-(2-aminoethyl)-3-aminopropyltrimethoxysilane or DATMS or DAMO);

X represents SH; L represents $CH_2CH_2CH_2$— and R represents $CH_2$—$CH_3$ (MPTES);
X represents $C_6H_5N$; L represents $CH_2CH_2$— and R represents $CH_2$—$CH_3$ (PETES);
X represents $CHCH_2O$; L represents $CH_2CH_2CH_2$ and R represents $CH_3$ (EPTMS);
and X represents Cl; L represents $CH_2CH_2CH_2$ and R represents $CH_3$ (CPTMS).

9. Solution according to claim 1, further comprising water in a concentration of less than 1% by volume.

10. Solution for activating the surface of a substrate according to claim 1, wherein said oxide is a silicon oxide.

11. Solution according to claim 2, comprising:
the activator in a concentration of from $10^{-5}$ M to $10^{-3}$ M;
the binder in a concentration of from $10^{-4}$ M to $10^{-2}$ M.

12. Solution according to claim 11, comprising:
the activator in a concentration of from $5\times10^{-5}$ M to $5\times10^{-4}$ M;
the binder in a concentration of from $5\times10^{-4}$ M to $5\times10^{-3}$ M.

13. Solution according to claim 1, wherein the binder is formed from one or more organic compounds selected from the group consisting of:
compounds comprising at least two glycidyl functions selected from the group consisting of 1,4-butanediol diglycidyl ether, ethylene glycol diglycidyl ether, propylene glycol diglycidyl ether, diethylene glycol diglycidyl ether, 4,4'-bisphenol A-diglycidyl ether, glyceryl triglycidyl ether and triglycidyl isocyanurate; and
compounds comprising two isocyanate functions selected from the group consisting of 1,2-phenylene diisocyanate; 1,3-phenylene diisocyanate; 1,4-phenylene diisocyanate; 1,4-diisocyanatobutane; 1,6-diisocyanatohexane; 1,8-diisocyanatooctane; 2,4-toluene diisocyanate; 2,5-toluene diisocyanate; 2,6-toluene diisocyanate; 3,3'-dimethoxy-4,4'-biphenylene diisocyanate; isophorone diisocyanate; m-xylylene diisocyanate; trans-1,4-cyclohexylene diisocyanate; 1,3-bis(1-isocyanato-1-methylethyl)benzene and 4,4'-methylenebis(phenyl isocyanate);
said solution comprising:
the activator in a concentration of from $5\times10^{-5}$ M to $5\times10^{-4}$ M;
the binder in a concentration of from $5\times10^{-4}$ M to $5\times10^{-3}$ M.

14. Solution according to claim 5, wherein the concentration of the organosilane compound is between $10\times10^{-3}$ M and $10\times10^{-2}$ M.

15. Solution according to claim 1, further comprising water in a concentration of less than 0.5% by volume.

16. Process for activating the surface of a substrate for the purpose of subsequently covering it with a metallic layer deposited via an electroless route, said surface being formed exclusively from a polymer or comprising at least one area formed from a polymer and at least one area formed from an oxide, comprising placing said surface of the substrate in contact with a solution according to claim 1.

17. Process for activating the surface of a substrate according to claim 16, wherein said surface of the substrate is placed in contact with the solution at a temperature of between 50 and 90° C., for a duration of 1 to 30 minutes.

18. Process for manufacturing an electronic device comprising the steps of:
a) activating the surface of a substrate, said surface being formed exclusively from a polymer or comprising at least one area formed from a polymer and at least one area formed from an oxide, by placing said surface in contact with a solution according to claim 1; and b) coating said surface thus activated by deposition, via an electroless route, of a metallic layer.

19. Process according to claim 18, wherein the step b) is performed by placing the activated surface in contact with a liquid solution containing:

at least one metal salt;
at least one reducing agent;
optionally, at least one stabilizer; and
an agent for adjusting the pH to a value of between 6 and 11;

under conditions for forming a metallic film at least 30 nanometers.

20. Process for manufacturing an electronic device according to claim 18, wherein the metallic layer is a nickel layer.

21. Process according to claim 20, wherein the step b) is performed by placing the activated surface in contact with an aqueous solution containing:

at least one metal salt, in a concentration of between $10^{-3}$ M and 1 M;
at least one reducing agent, in an amount of between $10^{-4}$ M and 1 M;
optionally, at least one stabilizer, in an amount of between $10^{-3}$ M and 1 M; and
an agent for adjusting the pH to a value of between 8 and 10;

under conditions for forming a metallic film at least 100 micrometers thick.

* * * * *